United States Patent [19]
Mirabella et al.

[11] Patent Number: 6,164,987
[45] Date of Patent: Dec. 26, 2000

[54] SHIELDING AND GROUNDING ASSEMBLY FOR ELECTRONIC EQUIPMENT

[75] Inventors: Michael J. Mirabella, Matawan; Yubo Yang, Edison, both of N.J.

[73] Assignee: Lucent Technologies Inc., Murray Hill, N.J.

[21] Appl. No.: 09/340,895

[22] Filed: Jun. 28, 1999

[51] Int. Cl.[7] ........................... H01R 13/648; H01R 9/03
[52] U.S. Cl. ............................................. 439/98; 639/610
[58] Field of Search ............................... 174/35 C, 35 R, 174/50, 2, 36; 439/98, 610, 607, 608, 609

[56] References Cited

U.S. PATENT DOCUMENTS

| | | | |
|---|---|---|---|
| 5,129,030 | 7/1992 | Petrunia | 385/135 |
| 5,866,843 | 2/1999 | Ikeda | 174/36 |
| 6,012,950 | 1/2000 | Vanbesien | 439/610 |

*Primary Examiner*—Brian Sircus
*Assistant Examiner*—Chandrika Prasad
*Attorney, Agent, or Firm*—David L. Davis

[57] ABSTRACT

A shielding and grounding assembly for conductive jacketed cables routed out of electronic equipment includes a conductive enclosure surrounding the equipment with circular openings to allow the cables to pass therethrough. Each circular opening is surrounded by a cylindrical flange. A flexible sheet formed of a conductive material is wrapped around the bundle of cables passing through each opening. The sheet is secured at a first end to the flange and at a second end to the bundle of cables.

9 Claims, 1 Drawing Sheet

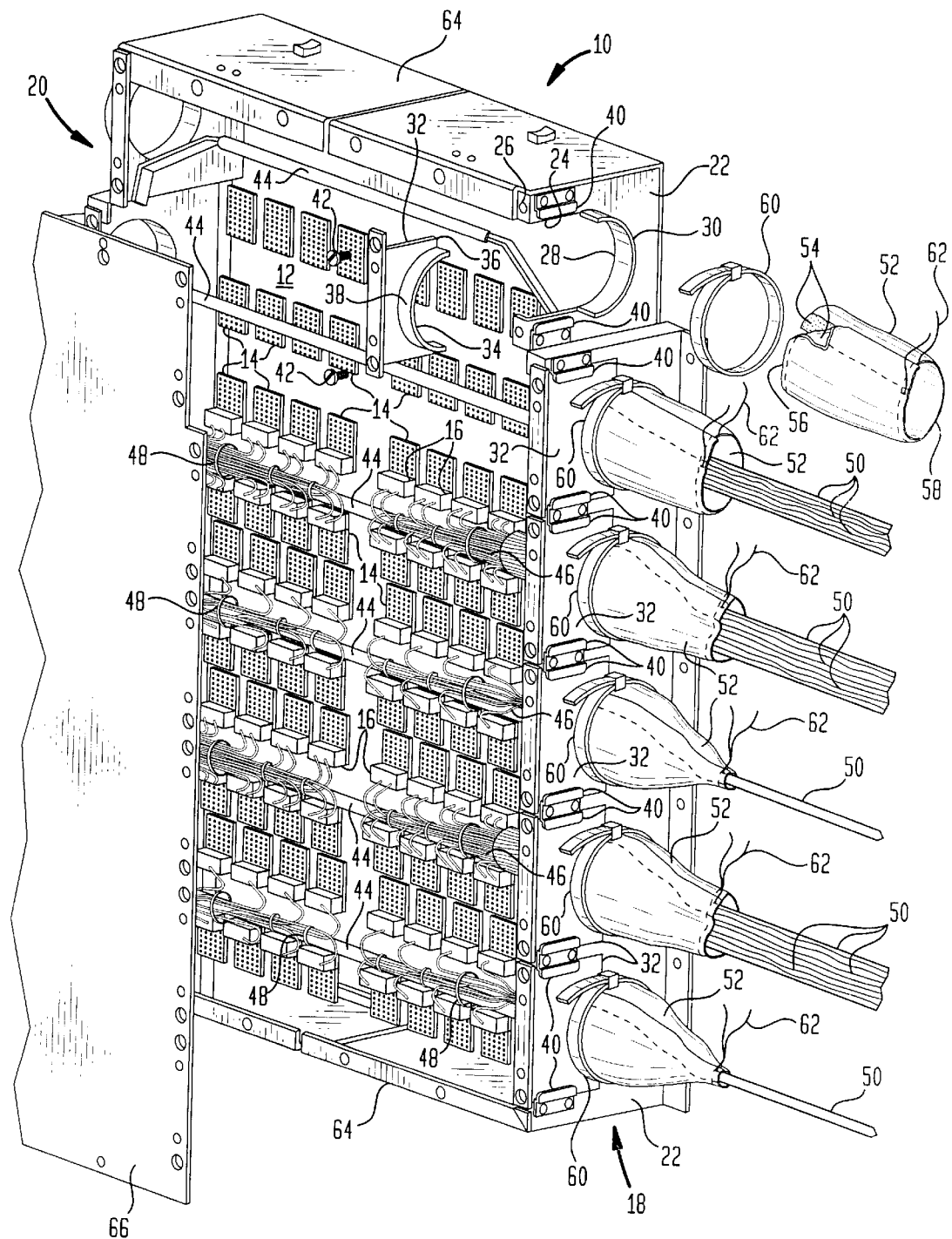

SHIELDING AND GROUNDING ASSEMBLY FOR ELECTRONIC EQUIPMENT

BACKGROUND OF THE INVENTION

This invention relates to the provision of a shielding and grounding assembly for electronic equipment.

Modern electronic systems equipment, such as for telecommunications purposes, often includes various subassemblies packed closely together and interconnected by cabling. Such systems operate at relatively high frequencies and therefore electromagnetic radiation and interference is often a problem. To obviate this problem, the cables often include a conductive outer jacket which provides shielding and grounding for the cable. In addition, the subassemblies are often encased within a conductive housing. While such a housing is somewhat effective, electromagnetic radiation can still pass through gaps where the cables pass through the housing. At the increasingly higher frequencies utilized in today's equipment, even a small gap permits unwanted electromagnetic radiation to pass therethrough. In addition, electrostatic discharges can travel along the cable jacket and harm sensitive electronic components. Accordingly, there exists a need to provide a more effective shielding and grounding assembly to eliminate as many gaps as possible and avoid the harmful effects of electrostatic discharge.

SUMMARY OF THE INVENTION

According to the present invention, conductive jacketed cables are routed out of a conductive enclosure by providing circular openings in the enclosure, each surrounded by a cylindrical flange. A flexible sheet formed of a conductive material is wrapped around the bundle of cables passing through the opening. The sheet is secured at a first end to the flange and at a second end to the bundle of cables. Accordingly, gaps where the cables pass through the opening are closed off by the flexible conductive sheet and a ground path is provided to drain off electrostatic discharges.

BRIEF DESCRIPTION OF THE DRAWINGS

The foregoing will be more readily apparent upon reading the following description in conjunction with the drawing in which the single FIGURE is an exploded perspective view of a shielding and grounding assembly constructed in accordance with this invention.

DETAILED DESCRIPTION

Referring now to the drawing, a unit of electronic equipment, designated generally by the reference numeral 10, is provided with a connector panel 12 having a plurality of pin fields 14 thereon. The pin fields 14 are used for effecting connections between the electronic equipment 10 and other pieces of electronic equipment. Such connections are effected by cables terminated by connector blocks 16 which engage the pin fields 14. Although the cables are typically provided with a conductive outer jacket, the outer jacket has to be removed to access the individual wires within the cables. Those individual wires are therefore susceptible to electromagnetic interference. In addition, if not properly grounded, the conductive outer jackets of the cables can carry harmful electrostatic discharges to the electronic equipment 10.

The purpose of the present invention is to provide shielding around the connector panel 12 and grounding for the conductive outer jackets of the cables. (The other side of the electronic equipment 10, which is not shown in the drawing, is also provided with shielding, which will not be described since it is not pertinent to the present invention.) The present invention provides a shielded enclosure around the connector panel which allows cables to pass through openings therein, and at the same time closes off all the openings. In addition, the present invention provides a secure grounding path for the conductive outer jackets of the cables.

As shown in the drawing, the connector panel 12 is substantially rectangular with four edges. According to the present invention, a pair of side shield assemblies 18, 20 are provided, each associated with a respective one of an opposed pair of the connector panel edges. The side shield assemblies 18, 20 are preferably identical to each other but one is rotated so that it can be mounted on the other side of the electronic equipment 10. Accordingly, only the side shield assembly 18 will be described in detail. The side shield assembly 18 includes a conductive main shield panel 22 which is adapted to be mounted adjacent to the connector panel 12 along a respective edge. The main shield panel 22 extends the entire length of the edge and is formed with at least one open slot 24 extending into the main shield panel 22 from the edge 26. The slot 24 is terminated by a substantially semicircular arc 28 and the main shield panel 22 includes a flange portion 30 which is adjacent to the arc 28 and extends away from the connector panel 12. The side shield assembly 18 also includes a secondary shield panel 32 which is formed with an open slot 34 extending into the secondary shield panel 32 from its edge 36. The slot 34 is substantially semicircular and of equal size as the arc 28. A flange portion 38 is adjacent to the slot 34 and is part of the secondary shield panel 32.

Mounted to the main shield panel 22 adjacent each slot 24 are a pair of guide members 40. The guide members 40 are bent into a zig zag shape to provide, together with the main shield panel 22, a pair of guide slots for holding the secondary shield panel 32. Thus, the secondary shield panel 32 can be slid into the guide slots formed by the guide members 40 so that the flange portions 30, 38 abut and together form a cylindrical flange surrounding a substantially circular opening defined by the arcs 28, 34. The secondary shield panel 32 may then be secured to the main shield panel 22 by screws 42 extending through appropriately sized and located openings in bent edges of the panels 22, 32.

When assembling cables to the electronic equipment 10, the connector blocks 16 are installed on the pin fields 14 and the cables are bundled together and moved transversely into the slots 24 of the main shield panel 22 before the secondary shield panel 32 is installed. To provide strain relief, rods 44 are provided which extend between the side shield assemblies 18, 20. The individual wires 46 of the cables are held to the rods 44 by fasteners 48, which illustratively are plastic cable ties. The wires 46 are only exposed outside the conductive outer jackets of the cables in the region between the side shield assemblies 18, 20. After all of the wires 46 are connected and secured, the cables 50 holding the wires 46 are bundled into groups and passed through the slots 24. The secondary shield panels 32 are then installed.

According to this invention, a conductive flexible sheet 52 is provided. The sheet 52 has secured along opposed edges hook and loop fastening material 54. The hooks and loops of the fastening material 54 are preferably silver coated, as is the underlying fabric base, so it too is conductive. Thus, the sheet 52 may be formed into a tubular shape having a first end 56 and a second end 58 and maintained in the tubular shape by the fastening material 54. The end 56 of the sheet 52 is wrapped around the flange formed by the flange portions 30, 38 and is held in place by a hose clamp 60. The remainder of the sheet 52 is wrapped around the bundle of cables 50 and its end 58 is drawn tightly around the cables 50, illustratively by a string 62 which is threaded through a hem formed at the end 58 of the sheet 52. Thus, by using the string 62, the sheet 52 can accommodate any number of cables. Further, if an opening in the side shield assembly 18 does not have any cables passing therethrough, the string 62 is pulled tight to close off the opening.

To complete the enclosure, conductive end panels 64 are provided. The end panels 64 are associated with the other opposed pair of connector panel 12 edges and extend the entire length of each such edge. At each of their ends, the end panels 64 are in contact with a main shield panel 22 of the side shield assemblies 18, 20. The edges of the end panels 64 and of the side shield assemblies 18, 20 which are remote from the connector panel 12 lie in a plane. Accordingly, there is provided a conductive cover panel 66 which is parallel to the connector panel 12 and is secured to the remote edges of the end panels 64 and the side shield assemblies 18, 20. Thus, a complete enclosure around the connector panel 12 is provided.

In addition to closing the openings in the side shield assemblies 18, 20 to provide a shield against electromagnetic radiation, the sheets 52 provide good electrical contact between the outer conductive jackets of the cables 50 and the cylindrical flanges of the side shield assemblies 18, 20. Accordingly, the outer conductive jackets of the cables 50 are grounded and harmful electrostatic discharges are prevented from reaching the internal components of the electronic equipment 10.

Accordingly, there has been disclosed an improved shielding and grounding assembly for electronic equipment. While an illustrative embodiment of the present invention has been disclosed herein, it is understood that various modifications and adaptations to the disclosed embodiment are possible and it is intended that this invention be limited only by the scope of the appended claims.

What is claimed is:

1. A shielding and grounding assembly for cables associated with electronic equipment, wherein the electronic equipment includes a connector panel and a plurality of cables connected to said connector panel, each of the plurality of cables having a conductive outer jacket, the shielding assembly comprising:

a conductive main shield panel adapted to be mounted adjacent to said connector panel along an edge thereof, said main shield panel being formed with a first open slot extending into said main shield panel from an edge thereof, said first open slot being terminated by a first substantially semi-circular arc, said main shield panel including a first flange portion adjacent said first arc and extending away from said connector panel;

a conductive secondary shield panel formed with a second open slot extending into said secondary shield panel from an edge thereof and shaped as a second substantially semi-circular arc, said secondary shield panel including a second flange portion adjacent said second arc, said secondary shield panel adapted to be secured to said main shield panel so that the first and second arcs of the first and second open slots together form a substantially circular opening surrounded by a cylindrical flange formed by the first and second flange portions;

a conductive flexible sheet adapted to be wrapped around said cylindrical flange and cables extending through said circular opening, so as to form a tube having first and second ends, with the first end wrapped around said cylindrical flange and the second end wrapped around said cables;

a first fastening member adapted to clamp the first end of the sheet tube to the circular flange; and a second fastening member adapted to clamp the second end of the sheet tube to the cables.

2. The assembly according to claim 1 wherein said first fastening member comprises a hose clamp.

3. The assembly according to claim 1 wherein said second fastening member comprises a length of string.

4. The assembly according to claim 1 wherein said sheet includes a hook and loop fastener along opposed edges extending between said first and second ends.

5. A shielding and grounding assembly for electronic equipment having a connector panel and a plurality of cables connected to said connector panel, each of the plurality of cables having a conductive outer jacket, and the connector panel being substantially rectangular with four edges, wherein the assembly comprises:

a pair of side shield assemblies each associated with a respective one of an opposed pair of connector panel edges and each including:

a conductive main shield panel adapted to be mounted adjacent to said connector panel along a respective edge thereof and extending the entire length of said respective edge, said main shield panel being formed with a first open slot extending into said main shield panel from an edge thereof, said first open slot being terminated by a first substantially semi-circular arc, said main shield panel including a first flange portion adjacent said first arc and extending away from said connector panel;

a conductive secondary shield panel formed with a second open slot extending into said secondary shield panel from an edge thereof and shaped as a second substantially semi-circular arc, said secondary shield panel including a second flange portion adjacent said second arc, said secondary shield panel adapted to be secured to said main shield panel so that the first and second arcs of the first and second open slots together form a substantially circular opening surrounded by a cylindrical flange formed by the first and second flange portions;

a conductive flexible sheet adapted to be wrapped around said cylindrical flange and cables extending through said circular opening, so as to form a tube having first and second ends, with the first end wrapped around said cylindrical flange and the second end wrapped around said cables;

a first fastening member adapted to clamp the first end of the sheet tube to the circular flange; and a second fastening member adapted to clamp the second end of the sheet tube to the cables;

a pair of conductive end panels each associated with a respective one of the other opposed pair of connector panel edges, each end panel adapted to be mounted adjacent to a respective connector panel edge and extending the entire length of said respective edge, and each end panel being in contact at each of its ends with a respective side shield assembly main shield panel; and a conductive cover panel parallel to said connector panel and secured to the main shield panels of said pair of side shield assemblies and to said pair of end panels.

6. The assembly according to claim 5 wherein each of the plurality of cables includes at least one group of wires within the respective outer jacket and terminated by a respective connector, and the respective outer jacket terminates between the pair of side shield assemblies to expose the at least one group of wires between the pair of side shield assemblies, the shield further comprising:

a rod extending between the pair of side shield assemblies substantially parallel to the connector panel; and a fastener securing the at least one group of wires to the rod.

7. The assembly according to claim 5 wherein said first fastening member comprises a hose clamp.

8. The assembly according to claim 5 wherein said second fastening member comprises a length of string.

9. The assembly according to claim 5 wherein said sheet includes a hook and loop fastener along opposed edges extending between said first and second ends.

* * * * *